(12) United States Patent  (10) Patent No.: US 8,817,468 B2
Hirashima  (45) Date of Patent: Aug. 26, 2014

(54) SWITCHING POWER SUPPLY

(75) Inventor: Shigeo Hirashima, Nagoya (JP)

(73) Assignee: Denso Corporation, Kariya (JP)

( * ) Notice: Subject to any disclaimer, the term of this patent is extended or adjusted under 35 U.S.C. 154(b) by 244 days.

(21) Appl. No.: 13/094,979

(22) Filed: Apr. 27, 2011

(65) Prior Publication Data

US 2011/0261531 A1 Oct. 27, 2011

(30) Foreign Application Priority Data

Apr. 27, 2010 (JP) ................................. 2010-101805

(51) Int. Cl.
*H05K 7/20* (2006.01)
(52) U.S. Cl.
USPC ........... 361/689; 361/690; 361/698; 361/699; 165/104.33; 165/80.4
(58) Field of Classification Search
None
See application file for complete search history.

(56) References Cited

U.S. PATENT DOCUMENTS

| | | | | |
|---|---|---|---|---|
| 5,978,220 A * | 11/1999 | Frey et al. | ...................... | 361/699 |
| 6,404,628 B1 * | 6/2002 | Nagashima et al. | .......... | 361/690 |
| 6,442,023 B2 * | 8/2002 | Cettour-Rose et al. | ........ | 361/690 |
| 6,588,647 B2 * | 7/2003 | Yamada et al. | ............ | 228/112.1 |
| 6,594,149 B2 * | 7/2003 | Yamada et al. | ................ | 361/699 |
| 7,331,378 B2 * | 2/2008 | Bhatti et al. | ................. | 165/80.4 |
| 7,450,388 B2 * | 11/2008 | Beihoff et al. | ................ | 361/715 |
| 7,561,429 B2 * | 7/2009 | Yahata et al. | ................. | 361/715 |
| 8,059,401 B2 * | 11/2011 | Guan | ............................. | 361/692 |
| 8,072,760 B2 * | 12/2011 | Matsuo et al. | ................ | 361/707 |
| 8,081,465 B2 * | 12/2011 | Nishiura | ........................ | 361/703 |
| 8,085,538 B2 * | 12/2011 | Noshadi et al. | ............... | 361/699 |
| 8,416,574 B2 * | 4/2013 | Tokuyama et al. | ........... | 361/699 |
| 2004/0190318 A1 | 9/2004 | Tsuchiya et al. | | |
| 2005/0067147 A1 * | 3/2005 | Thayer et al. | ................ | 165/80.4 |
| 2007/0039716 A1 * | 2/2007 | Yeh et al. | ...................... | 165/80.4 |
| 2010/0014247 A1 * | 1/2010 | Wang et al. | ................... | 361/692 |
| 2011/0051371 A1 * | 3/2011 | Azuma et al. | ................. | 361/699 |

FOREIGN PATENT DOCUMENTS

| | | |
|---|---|---|
| DE | 20 2007 012 971 | 12/2007 |
| EP | 0841842 | 5/1998 |
| JP | H09-083164 | 3/1997 |
| JP | 2004-297887 | 10/2004 |
| JP | 2007-273774 A | 10/2007 |
| JP | 2010-041838 | 2/2010 |

OTHER PUBLICATIONS

Notification of the First Office Action issued for Chinese Patent Application No. 201110111729.2, dated May 17, 2013 (with English translation).

\* cited by examiner

*Primary Examiner* — Boris Chervinsky
(74) *Attorney, Agent, or Firm* — Nixon & Vanderhye PC

(57) ABSTRACT

A switching power supply has electronic parts that configure a switching circuit. The electronic parts are accommodated in a casing. A seat member is formed unitarily with the casing on which the electronic parts are mounted. A coolant channel is formed through the seat member so as to be open at least at two positions of an outer wall surface of the casing. Coolant that flows through the coolant channel cools the electronic parts mounted on the seat member.

7 Claims, 12 Drawing Sheets

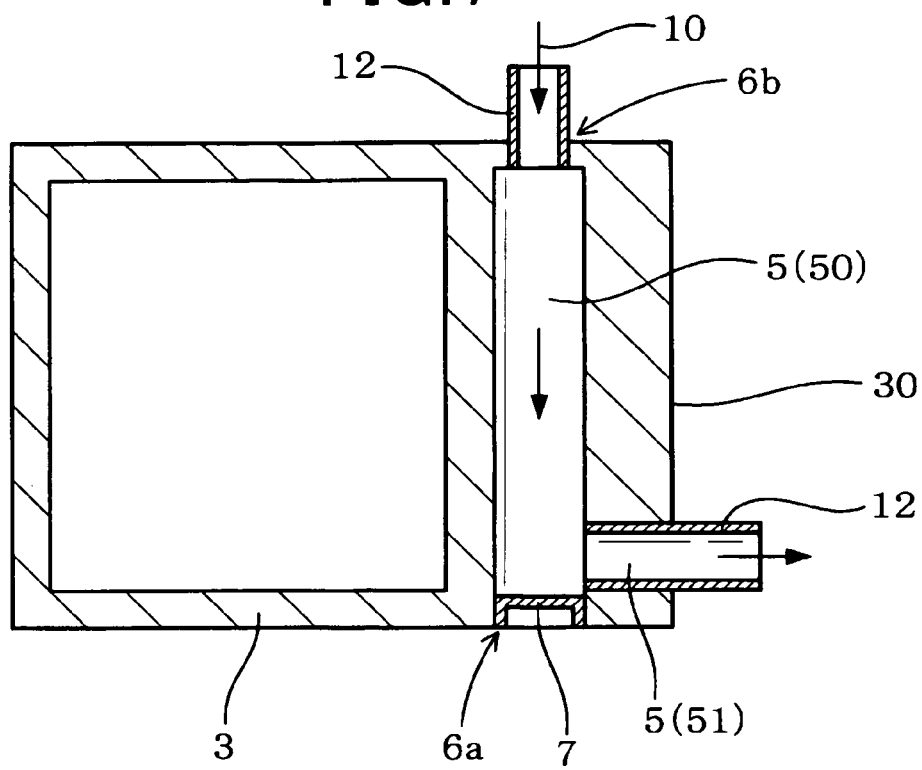
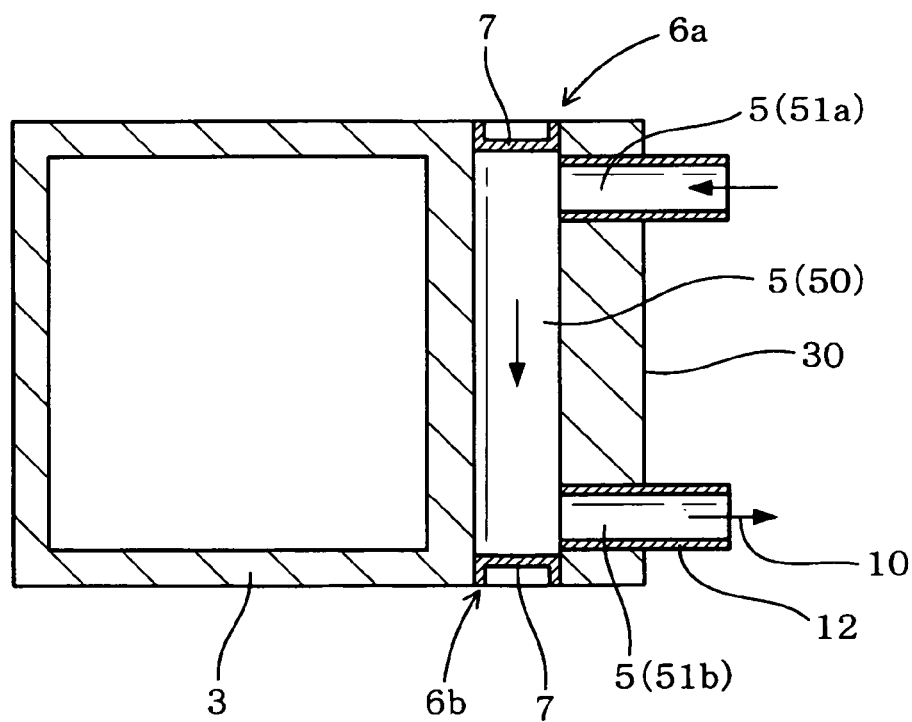

SWITCHING POWER SUPPLY

CROSS-REFERENCE TO RELATED APPLICATION

This application is based on and claims the benefit of priority from earlier Japanese Patent Application No. 2010-101805 filed Apr. 27, 2010, the description of which is incorporated herein by reference.

BACKGROUND OF THE DISCLOSURE

1. Technical Field of the Disclosure

The present disclosure relates to a switching power supply provided with a casing for accommodating electronic parts.

2. Related Art

It is well known that a switching power supply that includes electronic parts has a casing for accommodating the electronic parts.

FIGS. 16 and 17 illustrate such a switching power supply 90 based on conventional art. The switching power supply 90 is provided with a casing 92 accommodating electronic parts 91.

The casing 92 is provided with a coolant channel 93 through which a coolant 97 flows to cool the electronic parts 91. For example, such a switching power supply is disclosed in JP-A-2004-297887.

In the interior of the casing 92 of the switching power supply 90, the electronic parts 91 are mounted on the bottom surface. In the exterior of the casing 92, a serpentine recess 930 that will serve as the coolant channel 93 is formed.

The casing 92 is provided with a channel cover 94 which is attached and fixed thereto by bolts 990 or the like. The recess 930, together with the channel cover 94, forms an enclosed serpentine space outside the casing 92, which space serves as the coolant channel 93.

Also, in order to prevent leakage of the coolant 97, a sealing member 99 (see FIG. 16) is interposed between the channel cover 94 and the casing 92. The casing 92 is also provided with a protective cover 920 for protecting the electronic parts 91.

The channel cover 94 is formed with an inlet 95 and an outlet 96 for the coolant 97. The coolant 97 charged from the inlet 95 flows through the coolant channel 93 and discharged from the outlet 96. Thus, the electronic parts 91 are cooled.

However, the switching power supply 90 based on the conventional art needs such parts as the channel cover 94, the bolts 990 and the sealing member 99, besides the casing 92, to form the coolant channel 93. Thus, the switching power supply 90 of the conventional art has suffered from a problem of needing a number of parts.

Also, in order to screw the bolts 990, female thread portions 98 (see FIG. 17) are required to be formed in the casing 92. Therefore, there has been a problem that the size of the casing 92 is likely to be increased.

In addition, the switching power supply 90 of the conventional art requires a step of fastening the channel cover 94 to the casing 92 using the bolts 990 and a step of interposing the sealing member 99 between the channel cover 94 and the casing 92. Thus, the switching power supply 90 of the conventional art has also suffered from a problem of increasing the number of steps.

SUMMARY OF THE DISCLOSURE

An embodiment provides a compact-size switching power supply which is manufactured with a reduced number of parts and a reduced number of steps.

In a switching power supply according to a first aspect, the switching power supply includes electronic parts that configure a switching circuit, a casing that accommodates the electronic parts, a seat member formed unitarily with the casing on which the electronic parts are mounted, and a coolant channel formed through the seat member so as to be open at least at two positions of an outer wall surface of the casing. Coolant that flows through the coolant channel cools the electronic parts mounted on the seat member.

In the switching power supply according to a second aspect, the coolant channel includes a primary channel formed through the seat member, and a secondary channel extended in a direction of intersecting the primary channel for connection thereto, and the connection is established at a position between end portions of the primary channel, with one end of the secondary channel being open in an outer wall surface of the casing.

One end portion of the end portions of the primary channel is provided with a stopper so that the coolant flows from the other end portion to the secondary channel through the primary channel.

In the switching power supply according to a third aspect, the coolant channel includes a primary channel formed through the seat member, and a pair of secondary channels extended in a direction of intersecting the primary channel for connection thereto, and the connection is established at a position between end portions of the primary channel, with one end of the secondary channel being open in an outer wall surface of the casing Each of the end portions of the primary channel is provided with a stopper so that the coolant flows from one of the secondary channel to the other one of the secondary channel through the primary channel.

With this configuration, the degree of freedom of designing the switching power supply is enhanced.

Specifically, in the above configuration, one secondary channel may be used as an inlet of a coolant and the other secondary channel may be used as an outlet of the coolant. Since the secondary channels may be formed at optional positions between both ends of the primary channel, the positions of the inlet and the outlet of the coolant can be freely determined.

In the switching power supply according to a fourth aspect, the pair of secondary channels are extended in the same direction, the primary channel has a first side face on a side to which the pair of secondary channels are connected.

The first side face resides between the pair of secondary channels, and a second side face resides on an opposite side of the first side face with reference to the secondary channel on a downstream side.

The first side face coincides with the second side face regarding the position in a direction in which the secondary channels are extended.

With this configuration, pressure loss of the coolant is reduced. Specifically, let us assume that the first side face (see FIG. 15) of the primary channel does not coincide with the second side face thereof regarding the position in a direction in which the secondary channel is projected.

In this case, eddies will be caused in the coolant in a region including the second side face, and thus there is a tendency that pressure loss of the coolant is increased. In this regard, the above configuration is likely to allow the coolant to stay in the region including the second side face.

Accordingly, the fresh coolant is inhibited from entering the region to thereby allow the coolant to smoothly flow from the primary channel toward the secondary channel on a downstream side. In this way, pressure loss of the coolant is reduced.

In the switching power supply according to a fifth aspect, a cross-sectional area of the secondary channel, which is perpendicular to a direction of flow of the coolant, is made smaller than that of the primary channel.

A larger cross-sectional area of the primary channel will cause smaller pressure loss when the coolant flows, and also will achieve higher cooling efficiency. Meanwhile, a larger cross-sectional area of the secondary channels will also cause smaller pressure loss in the coolant.

However, if electronic parts are mounted above the primary channel, the larger cross-sectional area of each of the secondary channels will not so much contribute to raising the efficiency of cooling the electronic parts.

In addition, if the cross-sectional area of each secondary channel is made larger, a pipe or the like to be connected to the secondary channel is required to have a larger diameter accordingly, departing from the advantages such as of using a general-purpose pipe.

In this regard, with the above configuration of the present disclosure, each secondary channel may have a diameter in conformity with a general-purpose pipe or the like to be connected thereto, while the primary channel may have a larger cross-sectional area. In this way, pressure loss of the coolant is reduced and the efficiency of cooling the electronic parts is enhanced.

In the switching power supply according to a sixth aspect, the seat member has major surfaces on both sides thereof with an interposition of the coolant channel, different electronic parts are mounted on the major surfaces, and the electronic part mounted on one of the major surface of the seat member configures a switching circuit, while the electronic part mounted on the other one of the major surface of the seat member configures another switching circuit.

With the above configuration, two switching circuits are configured in a single casing.

Also, the electronic parts configuring the individual switching circuits are cooled using a single coolant channel. Thus, the number of casings and the number of coolant channels can both be reduced, whereby the switching power supply is manufactured at lower cost.

Further, since no stopper of the coolant channel is provided on the surface where the electronic parts are mounted, the coolant is prevented from flowing onto the surface of mounting the electronic parts.

Otherwise, the coolant would flow onto the surface of mounting the electronic parts in the event the coolant has leaked from a sealing portion between the stopper and the casing. Thus, the coolant will flow out of the switching power supply in the event of such leakage without flowing onto the surface of mounting the electronic parts.

Therefore, breakage or the like of the electronic parts would not be caused in the switching power supply.

In the switching power supply according to a seventh aspect, the switching power supply further includes a protective cover that covers the casing, and a weakly cooled area formed unitarily with the casing for mounting the electronic parts.

The amount of heat generated by the electronic parts mounted on the seat member is larger that of the electronic parts mounted on the weakly cooled area, and a distance from the seat member to the protective cover is shorter than a distance from the weakly cooled area to the protective cover.

BRIEF DESCRIPTION OF THE DRAWINGS

In the accompanying drawings:

FIG. 7 is a horizontal cross-sectional view illustrating the casing of a switching power supply according to the second embodiment;

FIG. 8 horizontal is a cross-sectional view illustrating a casing of a switching power supply according to a third embodiment of the present disclosure;

DETAILED DESCRIPTION OF THE PREFERRED EMBODIMENTS

With reference to the accompanying drawings, hereinafter will be described several embodiments of the present disclosure.

(First Embodiment)

Figure 1:
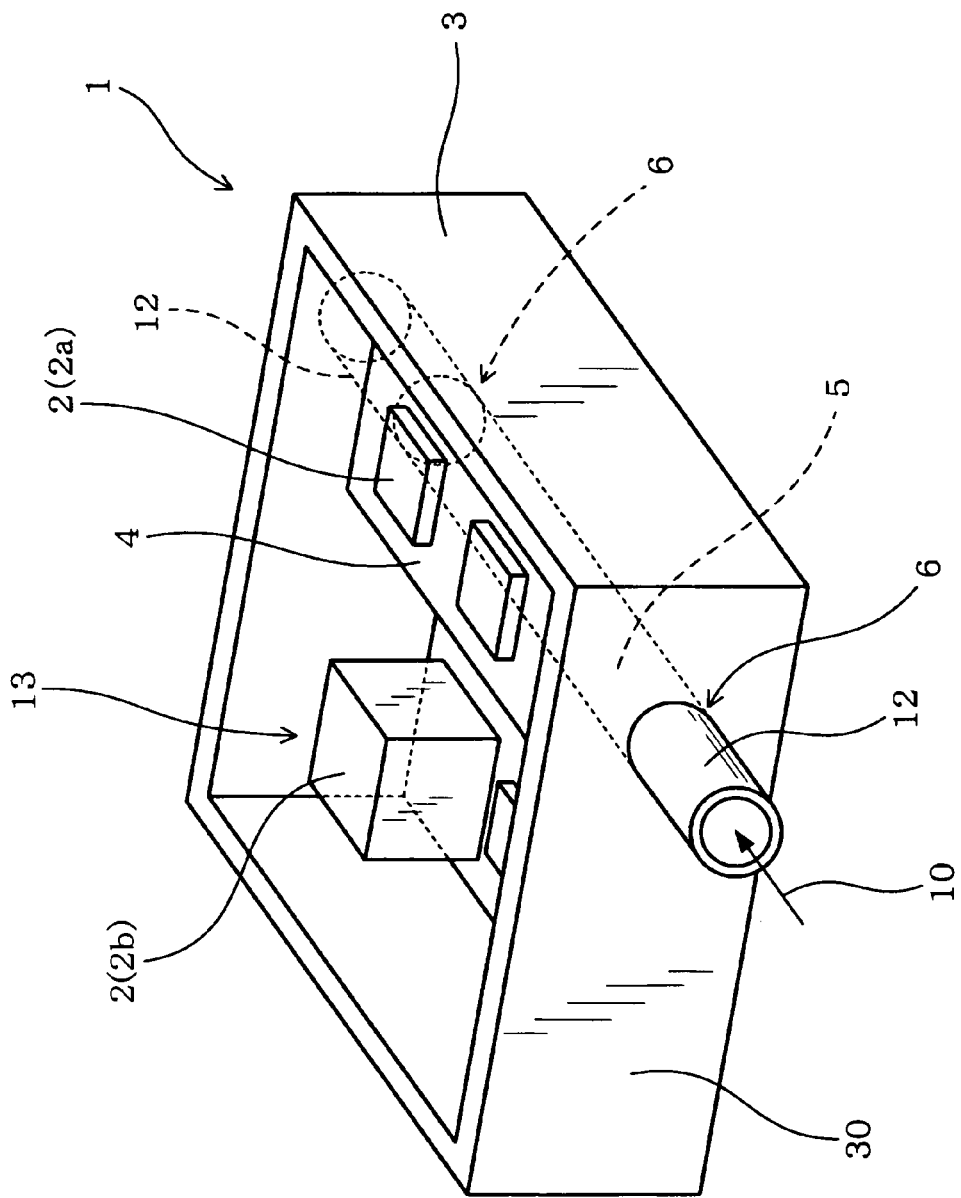
FIG. 1 is a perspective view illustrating a switching power supply according to a first embodiment of the present disclosure.

Referring to FIGS. 1 to 5, hereinafter is described a switching power supply according to a first embodiment of the present disclosure. FIG. 1 is a perspective view illustrating a switching power supply 1 according to the first embodiment.

As shown in FIG. 1, the switching power supply 1 of the present embodiment includes a switching circuit 13, electronic parts 2 configuring the switching circuit 13, a seat member 4 on which the electronic parts 2 are mounted and a coolant channel 5 through which a coolant 10 flows.

The electronic parts 2 are accommodated in a casing 3. The seat member 4 is integrally formed with the casing 3. The coolant channel 5 is formed through the seat member 4 so as to be open at least at two positions of an outer wall surface 30 of the casing 3.

The coolant 10 that flows through the coolant channel 5 cools the electronic parts 2 mounted on the seat member 4.

Specific description is set forth below.

As shown in FIG. 1, the coolant channel 5 has end portions 6 at both ends thereof, each of which is connected to a pipe 12. Piping, such as a hose (not shown), is attached to the pipes 12 to flow the coolant 10 through the coolant channel 5 of the switching power supply 1.

The casing 3 accommodates a plurality of electronic parts 2. Of the electronic parts 2, those electronic parts 2a which easily generate heat are mounted on the seat member 4, however, those electronic parts 2b which generate small amount of heat are not mounted on the seat member 4.

Figure 2:
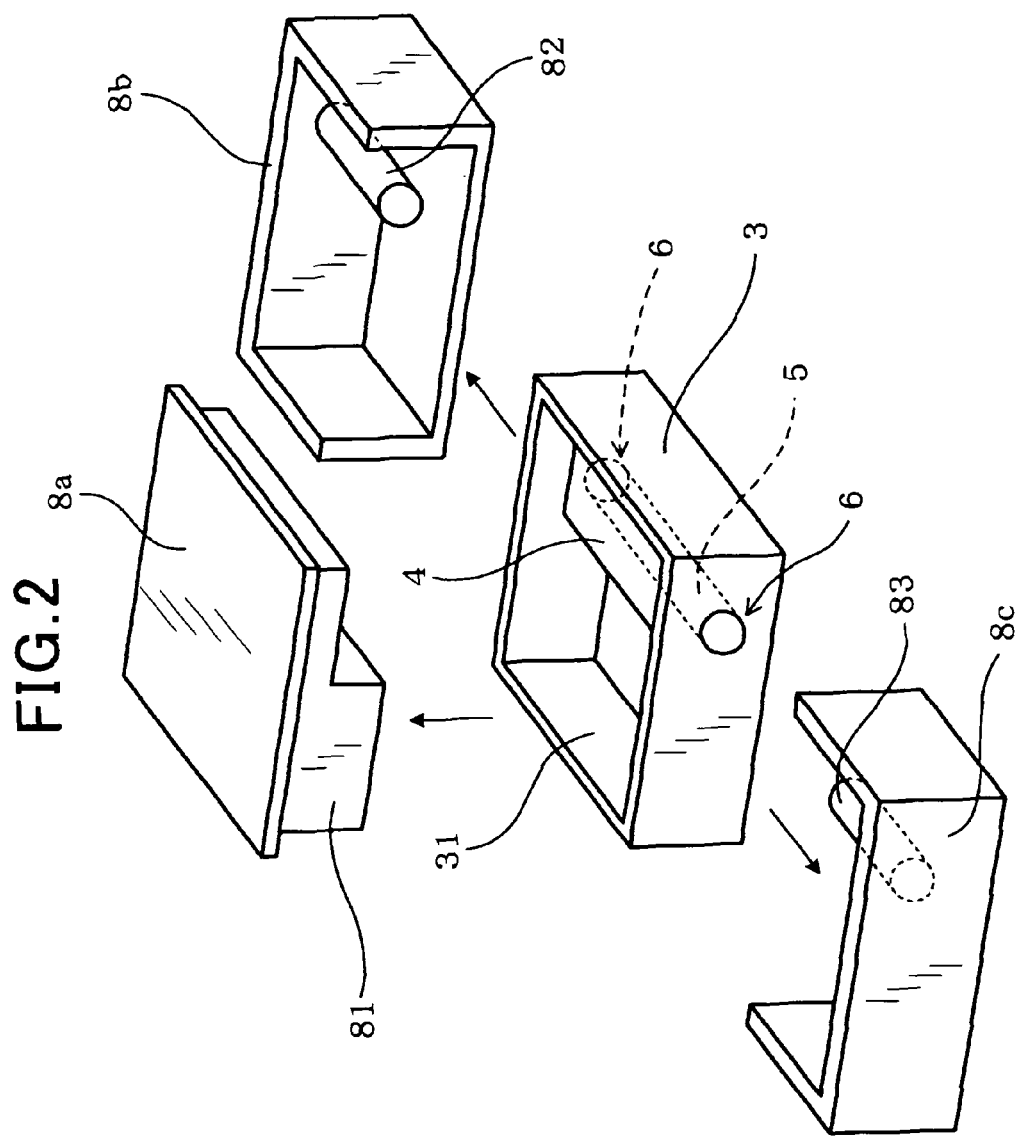
FIG. 2 is a perspective view illustrating a method of manufacturing a casing according to the first embodiment.

FIG. 2 is a perspective view illustrating a method of manufacturing the casing 3 of the first embodiment. As shown in FIG. 2, the casing 3 and the seat member 4 are integrally formed by casting.

Specifically, a plurality of casting mold parts 8a to 8c are assembled to provide a casting mold 8 into which molten metal is cast. Then, the molten metal is cooled and solidified, followed by withdrawing the casting mold parts 8a to 8c in the arrowed directions indicated in FIG. 2 to take out the casing 3.

The casting mold part 8a has a projection 81 corresponding to an accommodating space 31 of the casing 3. The casing molds 8b and 8c have columnar portions 82 and 83, respectively.

When the casting mold parts 8b and 8c are assembled, the columnar portions 82 and 83 are joined and the joined portions form a portion corresponding to the coolant channel 5.

It should be appreciated that the columnar portions 82 and 83 may be integrated into a single columnar portion to provide a casting mold part having a single columnar portion. Alternatively, instead of the columnar shape, the portions 82 and 83 may have a different shape in conformity with the shape of electronic parts to be mounted.

Figure 3:
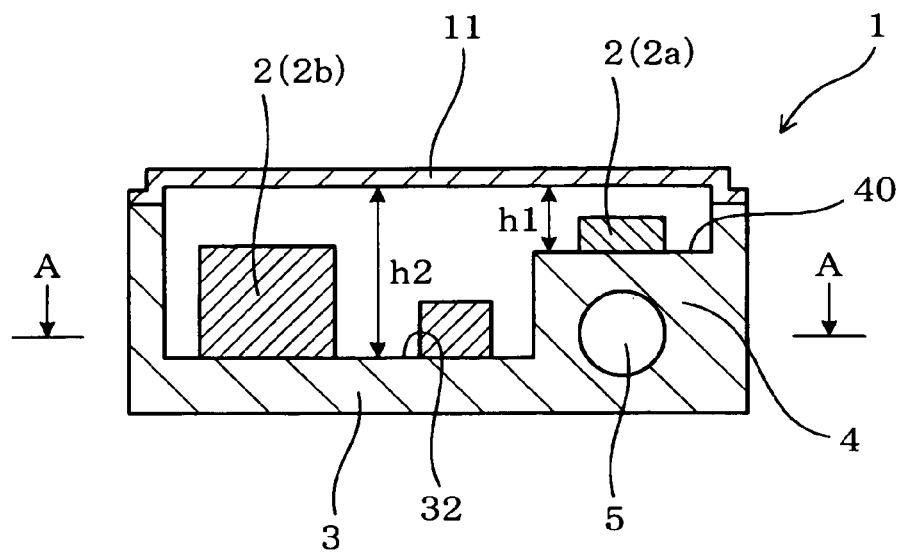
FIG. 3 is a vertical cross-sectional view illustrating the switching power supply taken along a B-B line of FIG. 4 according to the first embodiment.
Figure 4:
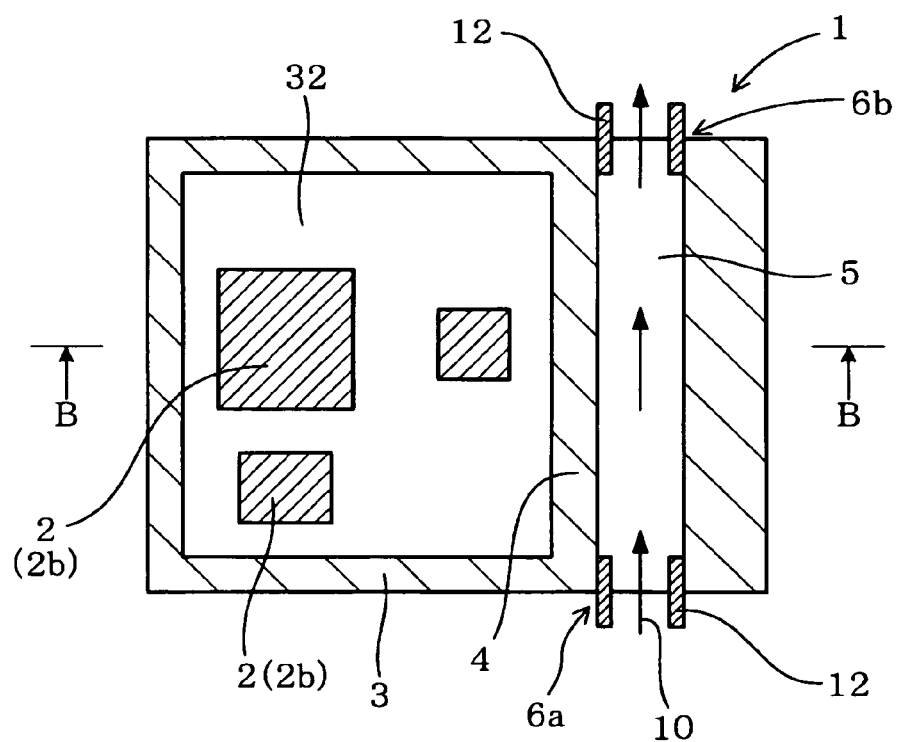
FIG. 4 is a horizontal cross-sectional view taken along an A-A line of FIG. 3.

FIG. 3 is a vertical cross-sectional view illustrating the switching power supply 1 of the first embodiment taken along a B-B line of FIG. 4. FIG. 4 is a horizontal cross-sectional view taken along an A-A line of FIG. 3.

After integrally molding the casing 3 and the seat member 4, the pipes 12 are attached, as shown in FIG. 4, to the respective end portions 6 of the coolant channel 5.

Further, as shown in FIG. 3, the electronic parts 2 are accommodated in the casing 3, and a protective cover 11 is attached to the casing 3 to protect the electronic parts 2.

As shown in FIGS. 3 and 4, the casing 3 has a weakly cooled area 32 for mounting the electronic parts 2b that generate less heat. Meanwhile, the seat member 4 has a mounting surface 40 for mounting the electronic parts 2a that easily generate heat, or generate large amount of heat.

The height from the weakly cooled area 32 to the protective cover 11 is h2 which is larger than h1 that is the height from the mounting surface 40 to the protective cover 11. In this way, the electronic parts 2b, if they have a large size, are ensured to be mounted in the weakly cooled area 32.

The electronic parts 2a that generate large amount of heat include, for example, semiconductor modules incorporating switching elements. The electronic parts 2b that generate small amount of heat include, for example, capacitors or reactors.

Figure 5:
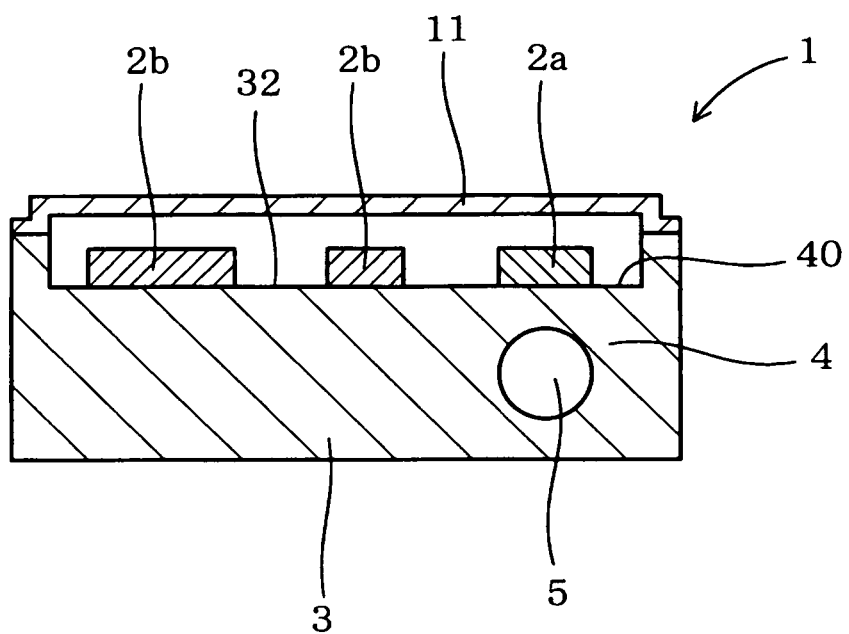
FIG. 5 is a vertical cross-sectional view illustrating the switching power supply according to the first embodiment, in which the level of a weakly cooled area is brought to the same level as that of the top surface of a seat member.

FIG. 5 is a vertical cross-sectional view illustrating the switching power supply 1 of the first embodiment, in which the level of the weakly cooled area 32 is brought to the same level as that of the mounting surface 40 of seat member 4.

As shown in FIG. 5, if the height of the electronic part 2b mounted on the weakly cooled area 32 is not so large, the weakly cooled area 32 may be permitted to reside in the plane extended from the mounting surface 40 of the seat member 4.

Hereinafter are described advantages and effects of the present embodiment.

In the present embodiment, the seat member 4 for mounting the electronic parts 2 is integrated with the casing 3, with the coolant channel 5 being formed through the seat member 4. Thus, in forming the coolant channel 5, the number of parts can be reduced, and at the same time, the size of the casing 3 can be reduced.

Figure 16:
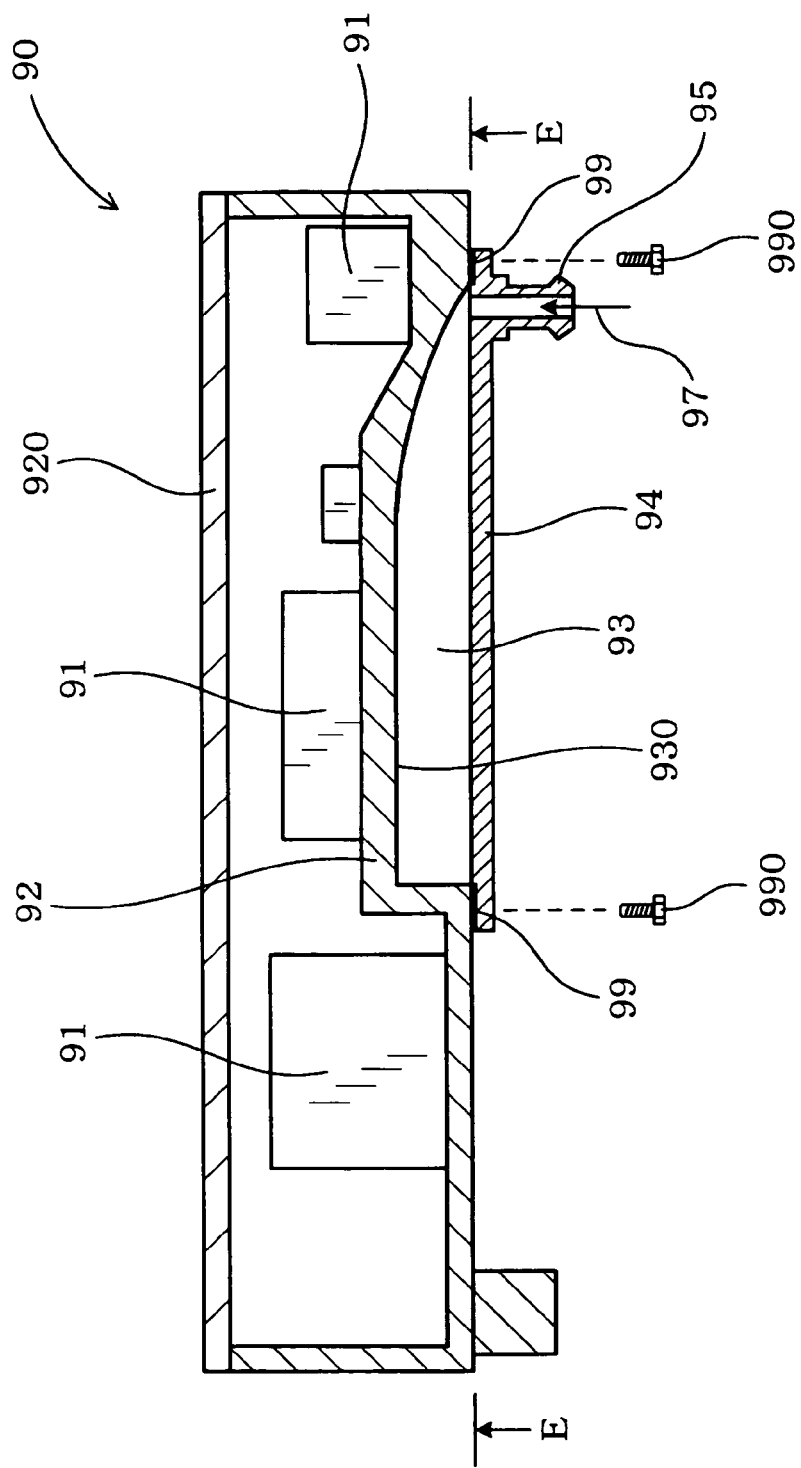
FIG. 16 is vertical a cross-sectional view illustrating a switching power supply according to conventional art taken along an F-F line of FIG. 17.
Figure 17:
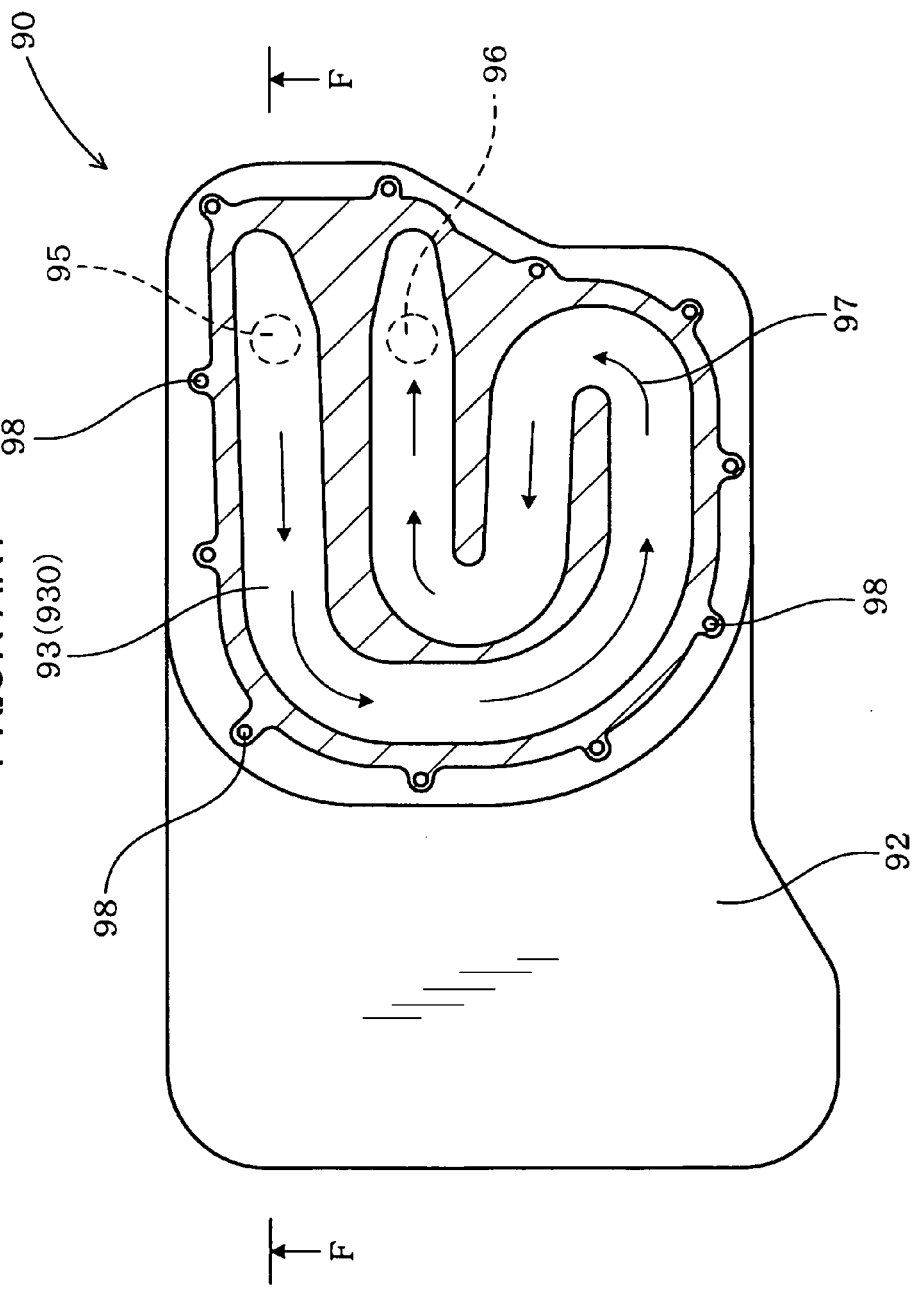
FIG. 17 is a horizontal cross-sectional view taken along an E-E line of FIG. 16.

Specifically, for example, let us compare the present embodiment with the case, as shown in FIG. 16, where the casing 92 is assembled with the channel cover 94 to form the coolant channel 93.

As will be understood from the comparison, the present embodiment dispenses with the channel cover 94, the bolts 990, and the like, and thus the number of parts can be reduced.

The present embodiment also dispenses with the female thread portions 98 for screwing the bolts 990 (see FIG. 16), whereby the size of the casing 3 can be reduced.

Further, the coolant channel 5 is formed through the seat member 4 which is integrated into the casing 3. Therefore, assemblage of a separately provided member is not necessary in forming the coolant channel 5. In other words, the step such as of connecting the channel cover 94 (see FIG. 16) to the casing 92, for example, can be omitted. Thus, the number of steps for manufacturing the switching power supply 1 is reduced.

As mentioned above, the electronic parts 2a that generate a large amount of heat include, for example, semiconductor modules whose height is small in general.

Therefore, when such semiconductor modules are arranged on the seat member 4 in which the coolant channel 5 is formed, adjustment to approximately the same height as the height h2 is possible. In this way, the dead space in the switching power supply is reduced to thereby reduce the size of the switching power supply.

As described above, in the switching power supply 1 according to the present embodiment, the size, the number of parts, and the number of steps are all reduced.

(Second Embodiment)

Figure 6:
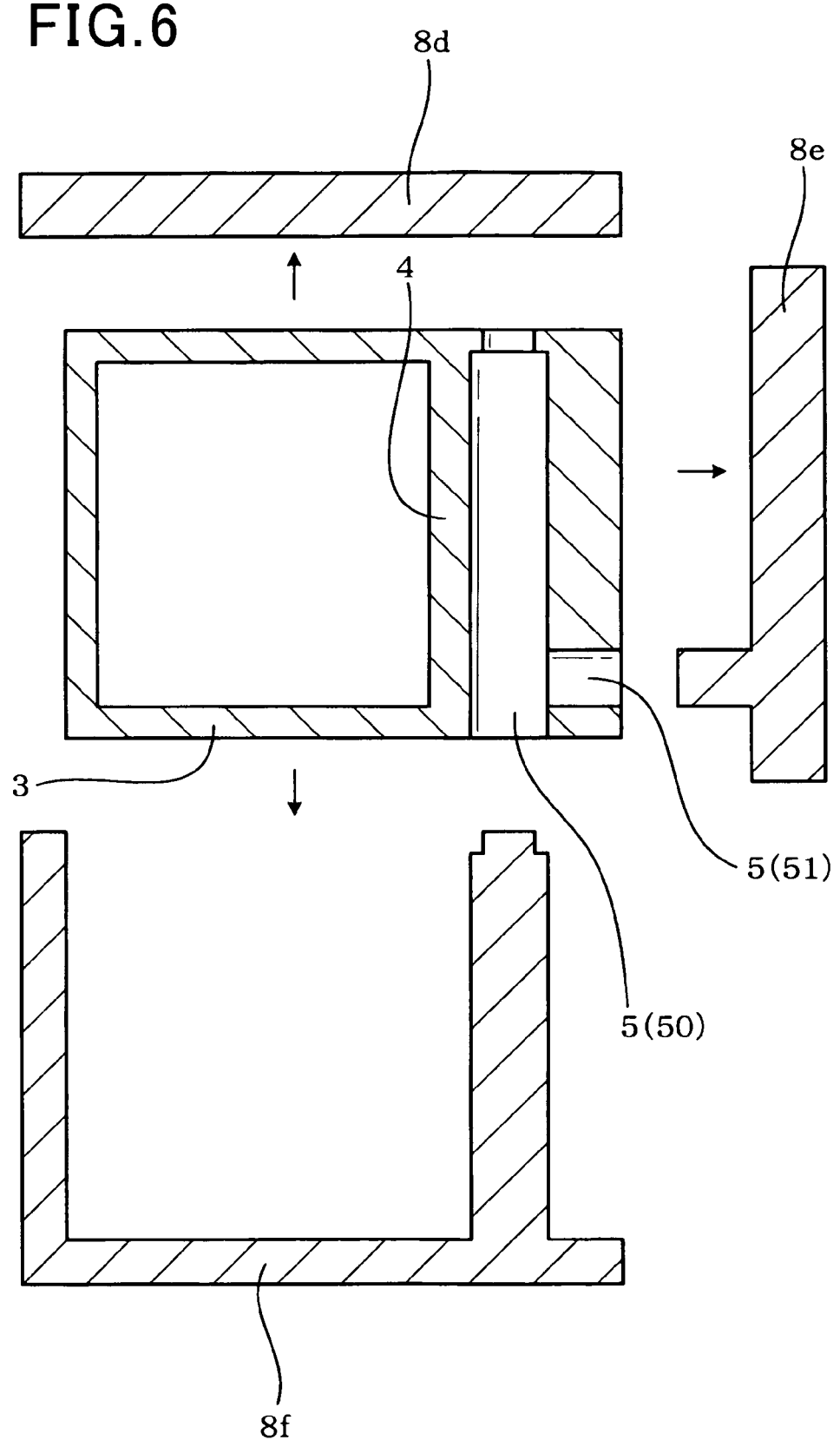
FIG. 6 is an explanatory view illustrating a method of manufacturing a casing according to a second embodiment of the present disclosure.

Referring to FIGS. 6 and 7, hereinafter is described a second embodiment of the present disclosure. FIG. 6 is an explanatory view illustrating a method of manufacturing the casing 3 according to the second embodiment. FIG. 7 is a horizontal cross-sectional view illustrating the casing 3 of the switching power supply 1 according to the second embodiment.

It should be appreciated that, in the second and the subsequent embodiments, the components identical with or similar to those in the first embodiment are given the same reference numerals for the sake of omitting explanation.

The second embodiment is different from the first embodiment in that the shape of the coolant channel 5 has been changed.

As shown in FIG. 7, the coolant channel 5 of the present embodiment includes a primary channel 50 and a secondary channel 51. The primary channel 50 is formed through the seat member 4. The secondary channel 51 is extended in the direction of intersecting the primary channel 50 for connection thereto.

The connection is established at a position between the end portions 6a and 6b of the primary channel 50, with one end of the secondary channel 51 being open in the outer wall surface 30 of the casing 3. Of the end portions 6a and 6b of the primary channel 50, the end portion 6a is provided with a stopper 7 so that the coolant 10 will flow, for example, from the end portion 6b to the secondary channel 51 through the primary channel 50.

In the present embodiment as well, the casing 3 is integrally formed with the seat member 4 by casting. Specifically, as sown in FIG. 6, a plurality of casting mold parts 8d to 8f are assembled to form the casting mold 8, followed by casting molten metal in the casting mold 8.

Then, the cast molten metal is cooled for solidification, followed by withdrawing the casting mold parts 8d to 8f in the arrowed directions indicated in FIG. 6.

It should be appreciated that the cross-sectional area of the secondary channel 51, which is perpendicular to the direction of flow of the coolant 10, is made smaller than that of the primary channel 50.

The remaining configuration is similar to the first embodiment.

The advantages and effects of the second embodiment will be described below.

The configuration of the second embodiment contributes to enhancing the degree of freedom of designing the switching power supply 1. Specifically, when the primary channel 50 alone is provided, the end portion 6a of the primary channel 50 necessarily has to be an inlet of the coolant, while the end portion 6b necessarily has to be an outlet of the coolant.

Thus, the positions of the inlet and the outlet cannot be freely changed. However, as shown in FIG. 7, with the configuration of the present embodiment, the secondary channel 51 is formed at an optional position between the end portions 6a and 6b of the primary channel 50. Accordingly, the position of at least one of the inlet and the outlet of the coolant is freely determined.

Also, with the above configuration of the present embodiment, the secondary channel may have a diameter in conformity with a general-purpose pipe or the like to be connected thereto, while the primary channel may have a larger cross-sectional area. In this way, pressure loss of the coolant is reduced and the efficiency of cooling the electronic parts is enhanced.

Other advantages and effects are similar to those of the first embodiment.

(Third Embodiment)

Referring to FIG. 8, a third embodiment of the present disclosure is described. FIG. 8 is a horizontal cross-sectional view illustrating the casing 3 of the switching power supply 1 according to the third embodiment.

As shown in FIG. 8, the coolant channel 5 of the third embodiment includes the primary channel 50 and a pair of secondary channels 51a and 5ab. The primary channel 50 is formed through the seat member 4.

The pair of secondary channels 51a and 51b is extended in the direction of intersecting the primary channel 50 for connection thereto. The connections are established at the positions between the end portions 6a and 6b of the primary channel 50.

The secondary channels 51a and 51b each have an end which is open in the outer wall surface 30 of the casing 3. Each of the end portions 6a and 6b of the primary channel 50 is provided with the stopper 7 so that the coolant 10 will flow, for example, from the secondary channel 51a to the secondary channel 51b through the primary channel 50.

The remaining configuration is similar to the first embodiment.

The advantages and effects of the third embodiment are described.

The configuration of the third embodiment contributes to further enhancing the degree of freedom of designing the switching power supply 1.

Specifically, in the configuration of the third embodiment, the secondary channel 51a may be used as an inlet of the coolant, for example, while the secondary channel 51b may be used as an outlet of the coolant.

Since the secondary channels 51a and 51b are formed at optional positions between the end portions 6a and 6b of the primary channel 50, the positions of the inlet and the outlet of the coolant can be freely determined.

Other advantages and effects are similar to those of the first embodiment.

(Fourth Embodiment)

Figure 9:
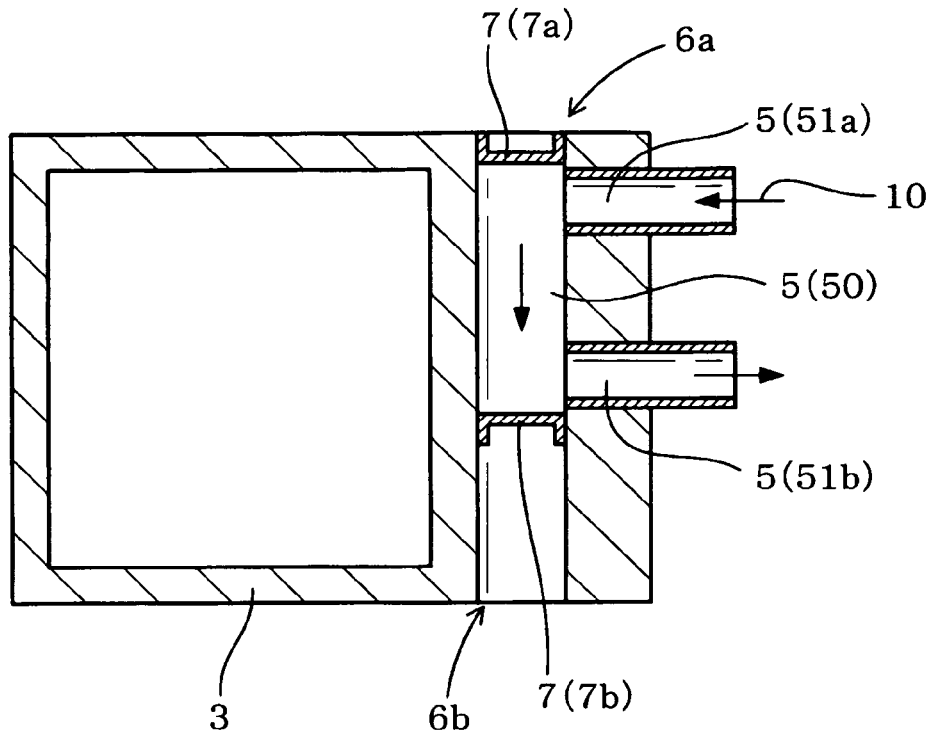
FIG. 9 is a horizontal cross-sectional view illustrating a casing of a switching power supply according to a fourth embodiment of the present disclosure.

Referring to FIG. 9, hereinafter is described a fourth embodiment of the present disclosure. FIG. 9 is a horizontal cross-sectional view illustrating the casing 3 of the switching power supply 1 according to the fourth embodiment.

As shown in FIG. 9, the coolant channel 5 of the fourth embodiment includes the primary channel 50 and a pair of secondary channels 51a and 51b. A stopper 7a is attached to the end portion 6a of the primary channel 50.

Another stopper 7b is provided in the primary channel 50 so as to be positioned nearer the end portion 6a with reference to the end portion 6b. The pair of secondary channels 51a and 51b is connected to the primary channel 50. The connection is established at positions between the stoppers 7a and 7b.

The remaining configuration is similar to the first embodiment.

The advantages and effects of the fourth embodiment are described.

The configuration of the present embodiment is effective in the case where the electronic parts 2 are mounted only in an area corresponding to the area that falls between the stoppers 7a and 7b. In the present embodiment, since one of the stoppers is provided at a position near the secondary channel 51b, the volume of the coolant in the channel is reduced.

Other advantages and effects are similar to those of the first embodiment.

(Fifth Embodiment)

Figure 10:
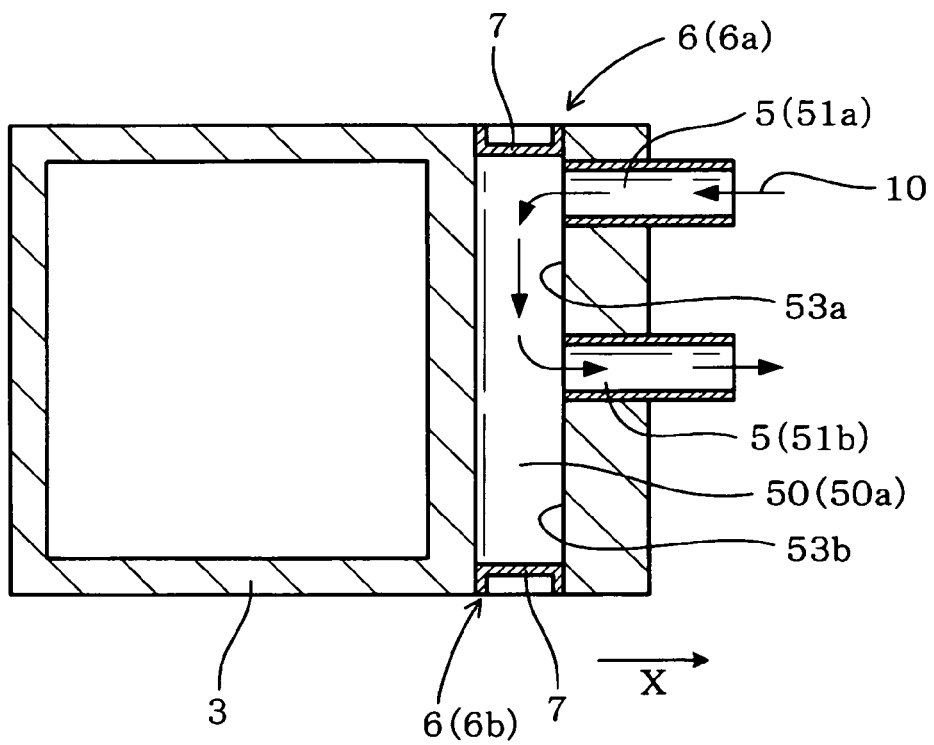
FIG. 10 horizontal is a cross-sectional view illustrating a casing of a switching power supply according to a fifth embodiment of the present disclosure.

Referring to FIG. 10, a fifth embodiment of the present disclosure is described. FIG. 10 is a horizontal cross-sectional view illustrating the casing 3 of the switching power supply 1 according to the fifth embodiment.

In the fifth embodiment, the shape of the coolant channel 5 has been changed. As shown in FIG. 10, the pair of secondary channels 51a and 51b of the present embodiment are extended in the same direction.

The primary channel 50 has a first side face 53a on the side to which the pair of secondary channels 51a and 51b are connected, the first side face 53a residing between the pair of secondary channels 51a and 51b.

The primary channel 50 also has a second side face 53b residing on the opposite side of the first side face 53a with reference to the secondary channel 51b on a downstream side.

The first side face 53a coincides with the second side face 53b regarding the position in a direction X in which the secondary channels 51a and 51b are extended.

The remaining configuration is similar to the first embodiment.

The advantages and effects of the fifth embodiment are described.

The configuration of the fifth embodiment contributes to reducing pressure loss of the coolant 10.

Figure 15:
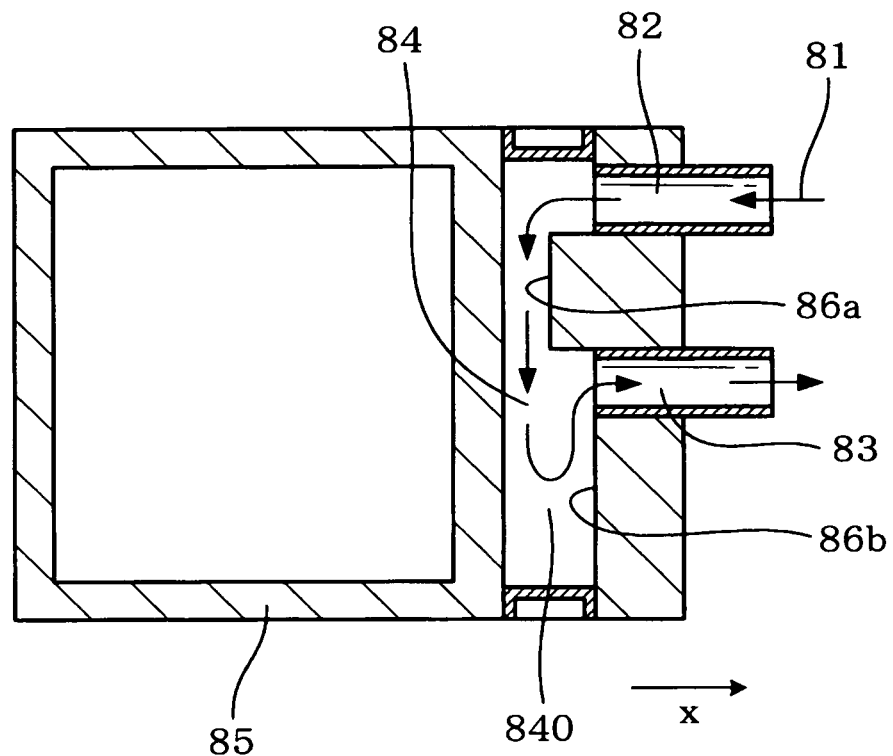
FIG. 15 is a horizontal cross-sectional view illustrating a casing of a switching power supply according to a comparative example.

FIG. 15 is a horizontal cross-sectional view of a casing of a switching power supply according to a comparative example.

As shown in FIG. 15, let us assume that a first side face 86a of a primary channel 84 does not coincide with a second side face 86b thereof regarding the position in a direction x in which secondary channels 82 and 83 are projected. In this case, eddies will be caused in a coolant 81 in a region 840 in the primary channel 84, the region 840 including the second side face 86a, and thus there is a tendency that pressure loss of the coolant 81 is increased.

In this regard, as shown in FIG. 10, the configuration of the present embodiment is likely to allow the coolant 10 to stay in a region 50a in the primary channel 50, the region 50a including the second side face 53b.

Accordingly, the coolant 10 is unlikely to newly enter the region 50a to thereby allow the coolant 10 to smoothly flow from the primary channel 50 toward the secondary channel 51b on a downstream side. In this way, pressure loss of the coolant 10 is reduced.

Other advantages and effects are similar to those of the first embodiment.

(Sixth Embodiment)

Figure 11:
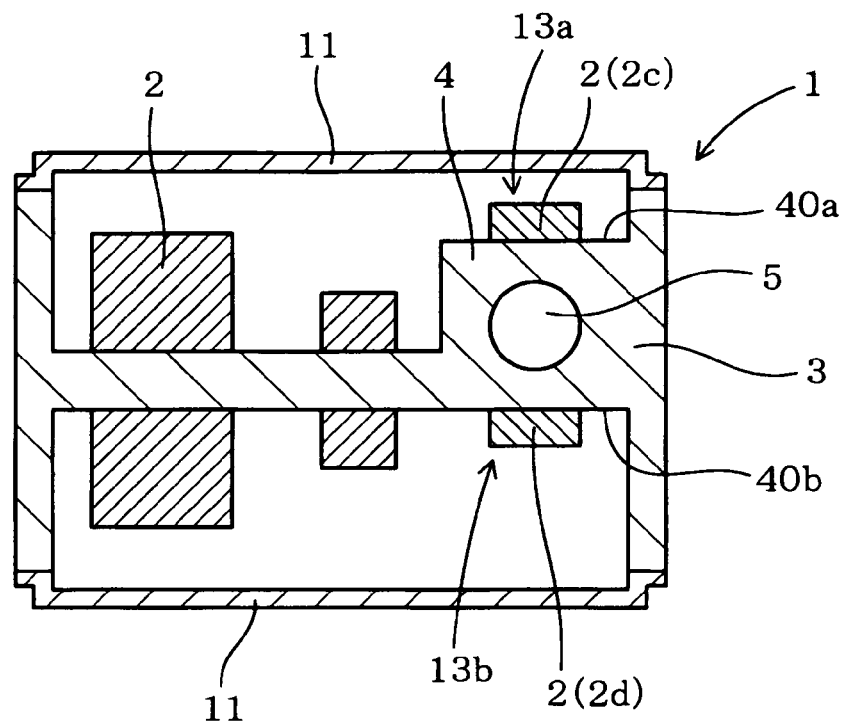
FIG. 11 is a vertical cross-sectional view illustrating a casing of a switching power supply according to a sixth embodiment of the present disclosure.

Referring to FIG. 11, a sixth embodiment of the present disclosure is described. FIG. 11 is a vertical cross-sectional view illustrating the casing 3 of the switching power supply 1 according to the sixth embodiment.

In the sixth embodiment, the shape of the casing 3 has been changed. As shown in FIG. 11, the seat member 4 has major surfaces 40a and 40b on both sides thereof with an interposition of the coolant channel 5. Different electronic parts 2c and 2d are mounted on the major surfaces 40a and 40b, respectively.

The electronic part 2c mounted on the major surface 40a of the seat member 4 configures a switching circuit 13a. Meanwhile, the electronic part 2d mounted on the major surface 40b of the seat member 4 configures another switching circuit 13b.

The remaining configuration is similar to the first embodiment.

The advantages and effects of the sixth embodiment are described.

With the configuration of the sixth embodiment, the two switching circuits 13a and 13b are configured within a single casing 3. Further, the electronic parts 2c and 2d configuring the switching circuits 13a and 13b, respectively, are cooled by a single coolant channel 5.

Thus, the number of the casings 3 and the number of the coolant channels 5 are both reduced. As a result, the number of parts of the switching power supply 1 is reduced to thereby realize the switching power supply 1 with a compact size.

Further, since no stopper of the coolant channel is provided on the surface where the electronic parts are mounted, the coolant is prevented from flowing onto the surface of mounting the electronic parts.

Otherwise, the coolant would flow onto the surface of mounting the electronic parts in the event the coolant has leaked from a sealing portion between the stopper and the casing. Thus, the coolant will flow out of the switching power supply in the event of such leakage without flowing onto the surface of mounting the electronic parts.

Therefore, breakage or the like of the electronic parts would not be caused in the switching power supply.

(Seventh Embodiment)

Figure 12:
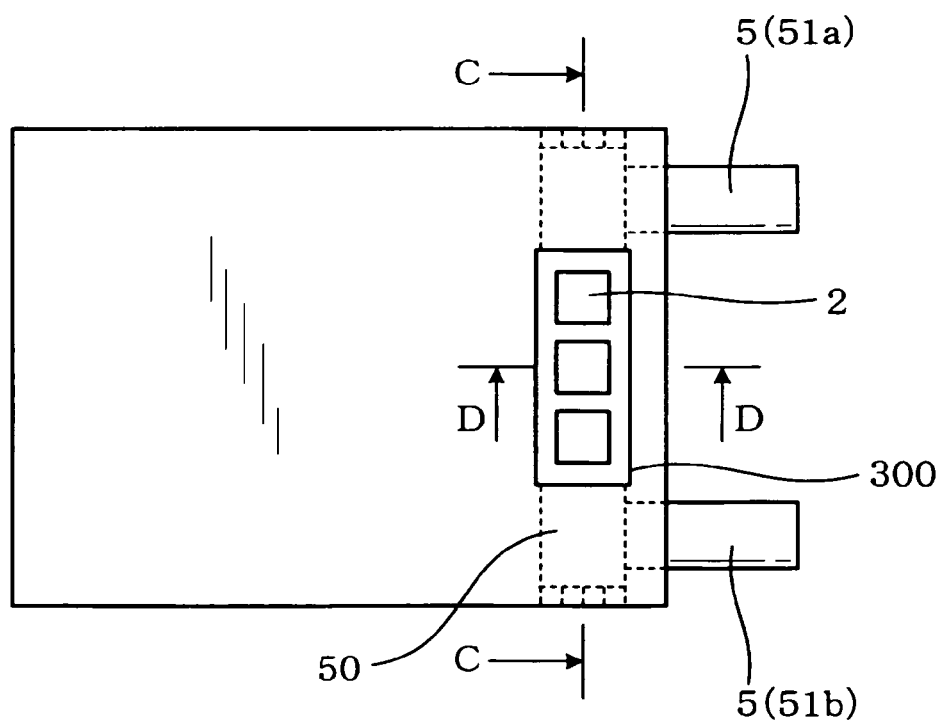
FIG. 12 is a plan view illustrating a switching power supply according to a seventh embodiment of the present disclosure.
Figure 13:
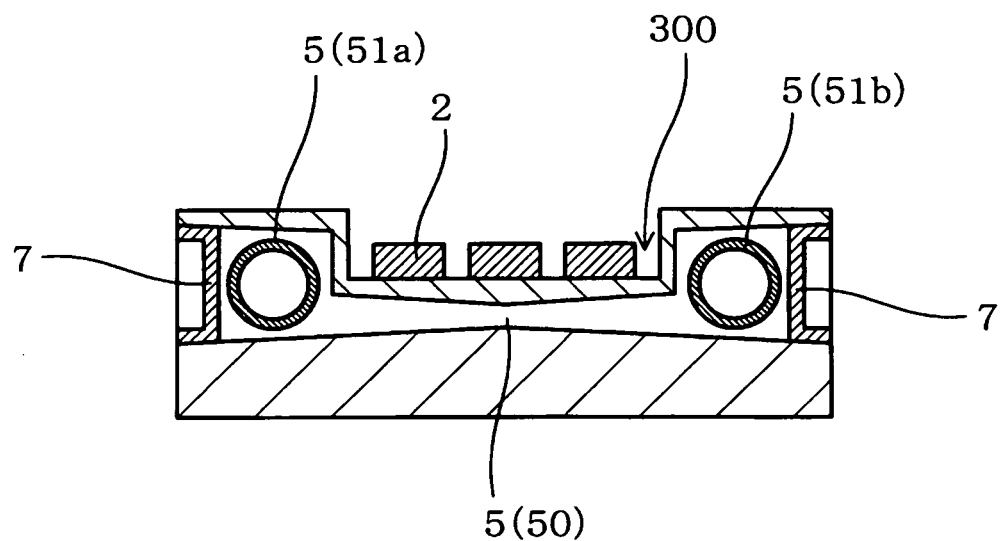
FIG. 13 is a vertical cross-sectional view taken along a C-C line of FIG. 12.
Figure 14:
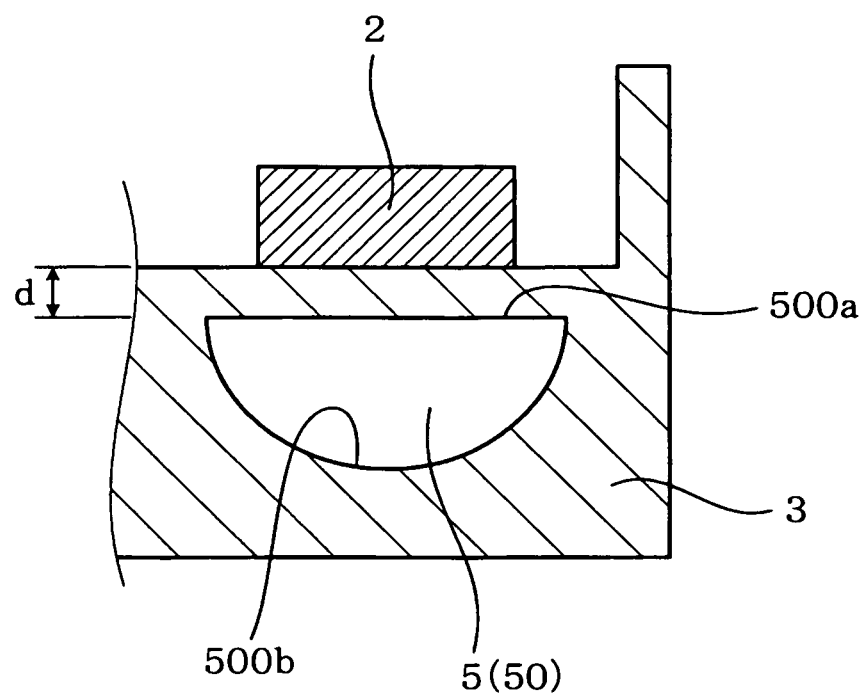
FIG. 14 is a vertical cross-sectional view taken along a D-D line of FIG. 12.

Referring to FIGS. 12 to 14, a seventh embodiment of the present disclosure is described. FIG. 12 is a plan view illustrating the switching power supply 1 according to the seventh embodiment. FIG. 13 is a vertical cross-sectional view taken along a C-C line of FIG. 12. FIG. 14 is a vertical cross-sectional view taken along a D-D line of FIG. 12.

In the seventh embodiment, the shapes of the casing 3 and the primary channel 50 have been changed. As shown in FIGS. 12 and 13, a recess 300 is formed in an area where the electronic parts 2 are mounted.

As shown in FIG. 14, the primary channel 50 has a semi-circular cross section perpendicular to the direction in which the coolant flows. Specifically, the primary channel 50 has a flat face 500a on the side near the electronic parts 2 and an arcuate face 500b on the side opposite to the flat face 500a.

Thus, the casing 3 has a reduced thickness d between the electronic parts 2 and the primary channel 50. At the same time, the area of cooling is enlarged, in which area the electronic parts 2 are mounted, to thereby enhance heat dissipation of the electronic parts 2.

Further, owing to the formation of the recess 300, the space in the casing 3 can be efficiently used and thus the size of the switching power supply 1 is reduced. Although the cross-sectional shape of the primary channel 50 in the present embodiment is semi-circular, a different shape may be used, depending such as on the constraints imposed by heat-generating parts or other parts.

The remaining configuration is similar to the first embodiment.

Various embodiments of the present disclosure have been described above. As will be understood from the description provided above, the present disclosure brings about the advantages as set forth below.

In the present disclosure, a seat member and a casing are integrally formed, with a coolant channel being formed through the seat member. Thus, the number of parts is reduced in forming the coolant channel and the size of the casing is also reduced.

Specifically, taking the case, as a comparison, where the casing 92 (see FIG. 16) and the channel cover 94 are assembled to form a coolant channel, the channel cover 94 and the bolts for fixing the channel cover to the casing 92 are not necessary in the present disclosure. Thus, the number of parts is reduced in the present disclosure.

Further, the female thread portions for screwing the bolts are not also necessary in the present disclosure. Thus, the size of the casing is reduced in the present disclosure.

Furthermore, the coolant channel is formed through the seat member that is integrated with the casing. Therefore, the casing has a smooth outline without a concavo-convex surface. Such a shape of the casing contributes to enhancing the degree of freedom in installing the switching power supply.

Also, additional members are not required to be assembled in forming the coolant channel. Specifically, for example, the step of connecting the channel cover 94 to the casing 92 (see FIG. 16) can be omitted. Thus, the number of steps can be reduced in manufacturing the switching power supply.

It is favorable that the casing and the seat member are integrally formed by casting. Use of casting enables integrally manufacturing the casing and the seat member as well as the coolant channel, whereby the number of parts is reduced and the configuration is simplified.

As described above, according to the switching power supply of the present disclosure, the size, the number of parts and the number of steps of manufacture are all reduced.

What is claimed is:

1. A switching power supply comprising:
electronic parts that configure a switching circuit;
a casing that accommodates the electronic parts;
a protective cover that covers the causing;

a weakly cooled area formed unitarily with the causing for mounting the electronic parts;

a seat member formed protruding from the casing unitarily with the casing on which the electronic parts are mounted; and a coolant channel formed penetrating through the seat member so as to be open at least at two positions of an outer wall surface of the casing;

wherein, coolant that flows through the coolant channel cools the electronic parts mounted on the seat member; and a distance from the seat member to the protective cover is shorter that a distance from the weakly cooled area to the protective cover.

2. The switching power supply according to claim 1, wherein the coolant channel includes a primary channel formed through the seat member, and a secondary channel extended in a direction of intersecting the primary channel for connection thereto, and the connection is established at a position between end portions of the primary channel, with one end of the secondary channel being open in an outer wall surface of the casing, and wherein one end portion of the end portions of the primary channel is provided with a stopper so that the coolant flows from the other end portion to the secondary channel through the primary channel.

3. The switching power supply according to claim 1, wherein the coolant channel includes a primary channel formed through the seat member, and a pair of secondary channels extended in a direction of intersecting the primary channel for connection thereto, and the connection is established at a position between end portions of the primary channel, with one end of the secondary channel being open in an outer wall surface of the casing, and wherein each of the end portions of the primary channel is provided with a stopper so that the coolant flows from one of the secondary channel to the other one of the secondary channel through the primary channel.

4. The switching power supply according to claim 3, wherein the pair of secondary channels are extended in the same direction, the primary channel has a first side face on a side to which the pair of secondary channels are connected, the first side face residing between the pair of secondary channels, and a second side face residing on an opposite side of the first side face with reference to the secondary channel on a downstream side, the first side face coincides with the second side face regarding the position in a direction in which the secondary channels are extended.

5. The switching power supply according to claim 2, wherein a cross-sectional area of the secondary channel, which is perpendicular to a direction of flow of the coolant, is made smaller than that of the primary channel.

6. The switching power supply according to claim 2, wherein the seat member has major surfaces on both sides thereof with an interposition of the coolant channel, different electronic parts are mounted on the major surfaces, and the electronic part mounted on one of the major surface of the seat member configures a switching circuit, while the electronic part mounted on the other one of the major surface of the seat member configures another switching circuit.

7. The switching power supply according to claim 1, wherein the switching power supply further comprises:

a protective cover that covers the casing, and a weakly cooled area formed unitarily with the casing for mounting the electronic parts, and wherein amount of heat generated by the electronic parts mounted on the seat member is larger that of the electronic parts mounted on the weakly cooled area, and a distance from the seat member to the protective cover is shorter that a distance from the weakly cooled area to the protective cover.

* * * * *